(12) United States Patent
Iida

(10) Patent No.: US 9,144,157 B2
(45) Date of Patent: Sep. 22, 2015

(54) MANUFACTURING METHOD OF PRINTED WIRING BOARD AND PRINTED WIRING BOARD

(75) Inventor: Hiroto Iida, Saitama (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 230 days.

(21) Appl. No.: 13/813,678

(22) PCT Filed: Jul. 28, 2011

(86) PCT No.: PCT/JP2011/067257
§ 371 (c)(1),
(2), (4) Date: Apr. 11, 2013

(87) PCT Pub. No.: WO2012/017909
PCT Pub. Date: Feb. 9, 2012

(65) Prior Publication Data
US 2013/0213701 A1 Aug. 22, 2013

(30) Foreign Application Priority Data
Aug. 3, 2010 (JP) ................................ 2010-174676

(51) Int. Cl.
*H05K 1/09* (2006.01)
*H05K 3/06* (2006.01)
(Continued)

(52) U.S. Cl.
CPC ................ *H05K 3/06* (2013.01); *H05K 1/0298* (2013.01); *H05K 3/425* (2013.01); *H05K 3/4652* (2013.01);
(Continued)

(58) Field of Classification Search
CPC ............. H05K 1/02; H05K 1/03; H05K 1/11; H05K 1/18; H05K 3/00; H05K 3/38; H05K 3/40; H05K 3/46; H01L 21/02; H01L 21/48; H01L 21/56; H01L 23/48; H01L 23/52; B23K 26/00; B23K 26/38

USPC ................ 174/257, 255, 260, 262, 264, 266; 361/750; 216/13, 17, 18, 65; 257/764, 257/774, 498; 205/125; 29/830, 852, 678; 204/450, 498; 438/124, 678
See application file for complete search history.

(56) References Cited
U.S. PATENT DOCUMENTS 5,544,773 A * 8/1996 Haruta et al. ................... 216/13
6,107,003 A * 8/2000 Kuwako ........................ 430/314
(Continued)

FOREIGN PATENT DOCUMENTS

JP 2003133726 5/2003
JP 2005064333 3/2005
(Continued)

OTHER PUBLICATIONS
Taiwan Office action, dated Dec. 27, 2013 along with an english translation thereof.
(Continued)

*Primary Examiner* — Xiaoliang Chen
(74) *Attorney, Agent, or Firm* — Greenblum & Bernstein, P.L.C.

(57) ABSTRACT

Object of the present invention is to provide a method for manufacturing a printed wiring board which enables fine wiring formation at low costs and with high yields without introducing any special equipment, and a printed wiring board manufactured by the method. To achieve the object, a method for forming the wiring pattern adopted includes steps; for forming a laminate having a structure in which a copper foil layer formed using copper foil without roughening treatment having surface roughness (Rzjis) at a bonding surface of 2 μm or less and thickness of 5 μm or less is laminated to a conductive layer via an insulating layer; for providing a blind-hole composed of a hole perforating the copper foil layer and the insulating layer; and a bottom composed of the conductive layer in the laminate; for filling-up the blind-hole by a electro-plated copper in the time for depositing an electro-plated copper layer on a surface of the electroless-plated copper layer to make the total thickness of a copper layer provided on the insulating layer 15 μm or less, for providing of an etching resist layer having thickness of 15 μm or less and for etching of the copper layer.

5 Claims, 2 Drawing Sheets

(51) Int. Cl.
*H05K 3/46* (2006.01)
*H05K 1/02* (2006.01)
*H05K 3/42* (2006.01)
*H05K 3/38* (2006.01)

(52) U.S. Cl.
CPC ............... *H05K 3/386* (2013.01); *H05K 3/421* (2013.01); *H05K 2201/0355* (2013.01); *H05K 2201/0358* (2013.01); *H05K 2201/09563* (2013.01)

(56) References Cited

U.S. PATENT DOCUMENTS

| | | | | |
|---|---|---|---|---|
| 6,300,244 | B1* | 10/2001 | Itabashi et al. | 438/678 |
| 6,518,182 | B1* | 2/2003 | Ishikawa et al. | 438/678 |
| 6,828,510 | B1* | 12/2004 | Asai et al. | 174/255 |
| 6,884,944 | B1* | 4/2005 | Kuwako | 174/262 |
| 2001/0042637 | A1* | 11/2001 | Hirose et al. | 174/255 |
| 2002/0030283 | A1* | 3/2002 | Itabashi et al. | 257/774 |
| 2004/0025333 | A1* | 2/2004 | Hirose et al. | 29/830 |
| 2005/0039948 | A1* | 2/2005 | Asai et al. | 174/262 |
| 2005/0155792 | A1* | 7/2005 | Ito et al. | 174/264 |
| 2006/0070769 | A1* | 4/2006 | Kim | 174/262 |
| 2007/0034519 | A1* | 2/2007 | Chinda et al. | 205/125 |
| 2007/0074902 | A1* | 4/2007 | Hirata | 174/262 |
| 2008/0007927 | A1* | 1/2008 | Ito et al. | 361/764 |
| 2008/0173473 | A1* | 7/2008 | Hirose et al. | 174/266 |
| 2008/0189943 | A1* | 8/2008 | Hirose et al. | 29/852 |
| 2008/0277148 | A1* | 11/2008 | Asai et al. | 174/255 |
| 2009/0053459 | A1* | 2/2009 | Hirose et al. | 428/76 |
| 2009/0154131 | A1* | 6/2009 | Hirose et al. | 361/803 |
| 2009/0314525 | A1* | 12/2009 | Kajino et al. | 174/255 |
| 2009/0314537 | A1* | 12/2009 | Hirose et al. | 174/263 |
| 2010/0032200 | A1* | 2/2010 | Hirose et al. | 174/261 |
| 2010/0122840 | A1* | 5/2010 | Asai et al. | 174/258 |
| 2010/0159647 | A1* | 6/2010 | Ito et al. | 438/124 |
| 2011/0127074 | A1 | 6/2011 | Takahashi et al. | |

FOREIGN PATENT DOCUMENTS

| | | |
|---|---|---|
| JP | 2006-64333 A | 3/2006 |
| JP | 2009-173017 | 8/2009 |
| JP | 2009-239188 | 10/2009 |
| JP | 2010-153628 | 7/2010 |
| TW | 200944370 | 11/2009 |
| WO | WO2009001850 | 12/2008 |
| WO | WO2009084533 | 7/2009 |

OTHER PUBLICATIONS

Japan Office action, dated Nov. 12, 2013 along with an english translation thereof.

U.S. Appl. No. 13/785,348 to Joji Fujii et al., filed Mar. 5, 2013.

* cited by examiner

MANUFACTURING METHOD OF PRINTED WIRING BOARD AND PRINTED WIRING BOARD

TECHNICAL FIELD

The present invention relates to a manufacturing method of a printed wiring board which adopts a filled via-hole as interlayer connection mean and to the printed wiring board. In particular, the invention relates to a manufacturing method of a printed wiring board in which a wiring pattern is formed by a subtractive method and to the printed wiring board.

BACKGROUND ART

Specifications of semiconductor integrated circuit devices (hereinafter referred to as "semiconductor devices") including microprocessor for computers have been made faster in operation speed and more multifunctional in recent years. Depending on such an increase in the operating speed and functions of semiconductor devices, the terminal pitch of a semiconductor device tends to be narrower and narrower. Accordingly, a finer wiring pattern is required for a packaging board or the like which is a printed wiring board for mounting a semiconductor device (hereinafter referred to as "packaging board or the like") due to a decrease in the terminal pitch of the semiconductor devices.

In the packaging board or the like, interlayer connection between an outer-layer circuit (surface-layer circuit) where a semiconductor device is mounted and an inner-layer circuit is achieved by filled via-holes (non-perforated holes) and/or plated through-holes (perforated holes). For example, Patent Document 1 discloses a method for manufacturing the packaging board or the like in which interlayer connection between an outer layer and an inner layer is achieved by non-perforated holes and perforated-holes; a copper foil to be an outer layer is laminated on an inner-layer board on which the inner-layer circuit is formed via insulating layer, the non-perforated holes and the perforated-holes for interlayer connection are provided, and an electroless-plated copper layer and an electro-plated copper layer are formed inside of the non-perforated holes and the perforated-holes and on the outer-layer copper foil. In the method, inside of the non-perforated holes are filled-up by electroless-plated copper and electro-plated copper to finish filled via-holes. Next, a plated copper layer composed of an electroless-plated copper and an electro-plated copper having a specific thickness is formed on the inner walls of each through-hole. Then, an outer-layer circuit is formed by a subtractive method. By the way, a packaging board or the like in the current marketplace requires a fine wiring pattern with the pitch of 40 μm or less and line/space (hereinafter referred to as L/S) of 20 μm/20 μm or less for the outer-layer circuit, for example, as a measure to a decreasing terminal pitch of a semiconductor device.

DOCUMENTS CITED

Patent Document

[Patent Document 1] Japanese Patent Laid-Open No. 2009-239188

SUMMARY OF INVENTION

Problems to be Solved

In Patent Document 1, an about 35 μm-thick plated copper layer is formed on the inner walls of each perforated-hole to assure interlayer connection. So, an about 35 μm-thick plated copper layer is also formed on the surface of a copper foil at outer layer. It means that formation of a fine wiring pattern having L/S of 20 μm/20 μm or less by a subtractive method using the method described in Patent document 1 is made difficult. This is because the outer copper layer is too thick.

Next, the method disclosed in Patent Document 1 uses roughening-treated copper foil. Even when thickness of the outer copper layer disclosed in Patent Document 1 is reduced further by an etch-down method, it is difficult to form a fine wiring pattern having L/S of 20 μm/20 μm or less because overetching is indispensable to completely etched-out the roughening-treatment.

Further, the method disclosed in Patent document 1 carries out copper plating after etch-down the outer-layer copper foil, followed by further etch-down the plated copper layer. As the frequency of an etch-down increases, the in-plane thickness deviation of the copper layer is made larger as thickness of the copper layer to be etched increases and it makes accuracy of wiring formation poor because ability in pattern formation as designed is lost.

On the other hand, methods for achieving such fine wiring formation by a subtractive method including vacuum etching and anisotropic etching are known. However, all of these methods require peculiarity in equipments and management of etching liquids.

Next, a semi-additive method may enable fine wiring formation discussed above. However, higher manufacturing costs and lower production yields is general in the semi-additive method compared to a subtractive method. In addition, a plating thickness exceeding 20 μm is indispensable when the semi-additive method is used for formation of a wiring pattern together with filling-up of blind-holes for interlayer connection by the electrolytic copper plating, for example.

As described above, manufacturing method of a printed wiring board which enables formation of fine wiring to answer decreasing of terminal pitch in semiconductor devices at low costs and with high yields without introducing of any special equipment; and printed wiring boards manufactured by the method have been required in the marketplace.

Means to Solve the Problem

Hence, the present inventor has made a diligent study to achieve the object and thought out manufacturing method of a printed wiring board and a printed wiring board according to the present invention.

To achieve the object described above, manufacturing method of the printed wiring board according to the present invention is characterized in including; a laminate formation step for forming a laminate having a structure in which a copper foil layer formed using copper foil without roughening treatment having surface roughness (Rzjis) at a bonding surface of 2 μm or less having thickness of 5 μm or less and a conductive layer are laminated via an insulating layer; a blind-hole formation step for providing a blind-hole composed of a hole perforating the copper foil layer and the insulating layer and a bottom composed of the conductive layer in the laminate; an electroless copper plating step for providing an electroless-plated copper layer on the surface of the copper foil layer and inner wall of the blind-hole; a panel plating step for providing an electro-plated copper layer on the surface of the electroless-plated copper layer to make the total thickness of a copper layer provided on the insulating layer of 15 μm or less and same time fill-up the blind-hole by an electro-plated copper to a level substantially even with the surface of the electro-plated copper layer; an etching resist formation step for providing an etching resist layer having thickness of 15 μm or less on a surface of the electro-plated copper layer; and an etching step for etching the copper layer not covered with the etching resist layer to form a wiring pattern.

In the manufacturing method of the printed wiring board according to the present invention, a sum thickness of the copper foil without roughening treatment layer and the electroless-plated copper layer after the electroless copper plating in the electroless copper plating step is preferably 3 μm or less.

In the manufacturing method of the printed wiring board according to the present invention, the wiring pattern formed in the etching step is preferably L/S of 20 μm/20 μm or less.

In the manufacturing method of the printed wiring board according to the present invention, a copper foil provided with a primer resin layer in which a primer resin layer which assures adhesion to the insulating layer is provided on the bonding surface of the copper foil without roughening treatment is preferably used when the copper foil without roughening treatment and the conductive layer are laminated via the insulating layer in the laminate formation step.

The printed wiring board according to the present invention is characterized in that a copper layer and a conductive layer sandwiching an insulating layer are interlayer-connected by a filled via-hole comprising a bottom composed of the conductive layer, wherein the copper layer has a structure composed of a copper foil layer formed using copper foil without roughening treatment having surface roughness (Rzjis) at a bonding surface of 2 μm or less having thickness of 5 μm or less, an electroless-plated copper layer and an electro-plated copper layer in this order; the electro-plated copper layer is formed on a surface of the electroless-plated copper layer by a panel plating method to make the sum thickness (D) of the copper layer provided on the insulating layer is 15 μm or less; and filling-up of the filled via-hole by the electro-plated copper to a level substantially even with the surface of the electro-plated copper layer is finished in the time for depositing the electro-plated copper layer provided on the insulating layer.

In the printed wiring board according to the present invention, a sum thickness of the copper foil without roughening treatment layer and the electroless-plated copper layer is preferably 3 μm or less in the copper layer.

In the printed wiring board according to the present invention, a wiring pattern formed in the copper layer is preferably L/S of 20 μm/20 μm or less.

Advantages of the Invention

According to the present invention, thickness of an electro-plated copper layer formed on the outer-layer by plated copper in the time for filling-up a blind-hole can be reduced compared to a case in which interlayer connection is achieved by a plated through-hole because just a filled via-hole is used for interlayer connection between an outer-layer circuit and an inner-layer circuit. Specifically, thin copper layer having thickness of 15 μm or less can be provided on the insulating layer because the blind-hole is filled-up with the electro-plated copper layer to a level substantially even with a surface of the electro-plated copper layer in the time for depositing the electro-plated copper layer on a surface of the electroless-plated copper layer provided on the insulating layer in a panel plating step. Accordingly, a fine wiring pattern having L/S of 20 μm/20 μm or less can be formed by a subtractive method without reduction of the copper layer thickness after the formation of the electroless-plated copper layer and electroplated copper layer.

In addition, overetching for dissolving roughening-treatment of the copper foil layer is dispensable because the copper foil layer is formed by a copper foil without roughening treatment having an extremely smooth bonding surface in the present invention. Accordingly, a decrease in top width of the wiring is prevented compared to when overetching is required, and it enables formation of a finer wiring pattern.

Further, an etch-down step for the copper foil prior to the formation of the electroless-plated copper layer is dispensable because the copper foil layer is formed using an ultra-thin copper foil having thickness of 5 μm or less in the present invention. Furthermore, an etch-down step for the copper layer after formation of the electro-plated copper layer is dispensable also in the present invention because the electro-plated copper layer is formed to have the total thickness of the copper layer provided on the insulating layer of 15 μm or less. Consequently, accuracy of circuit formation and reliability of an obtained circuit is enhanced because in-plane thickness deviation in the copper layer due to etch-down process is reduced, according to the present invention.

According to descriptions above, manufacturing of a fine wiring pattern having L/S of 20 μm/20 μm or less at low costs and with excellent yields by a subtractive method is achieved according to the present invention without introducing of any special equipment.

DETAILED DESCRIPTION OF THE INVENTION

Embodiments of a printed wiring board and manufacturing method of a printed wiring board according to the present invention will be described one by one.

1. Printed Wiring Board

Figure 1:
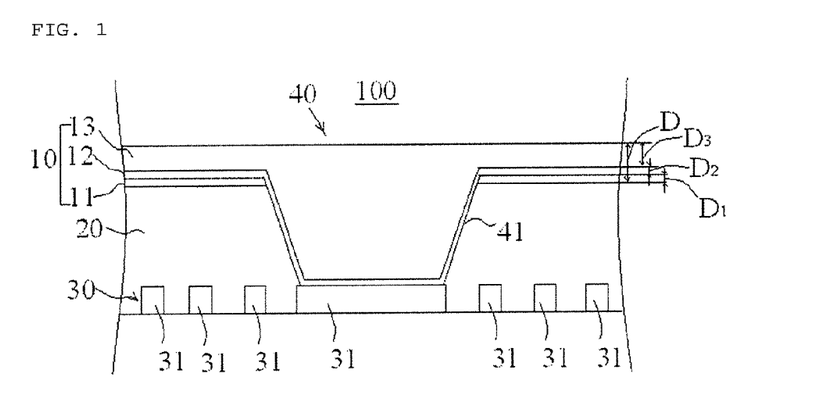
FIG. 1 is a side view schematically showing the layer structure of a printed wiring board according to the present invention.

A printed wiring board 100 according to the present invention will be first described. The printed wiring board 100 according to the present invention is a double-sided printed wiring board or a multilayer printed wiring board comprising three or more layers of conductive patterns. The printed wiring board according to the present invention can be suitably used as a printed wiring board including a packaging board and an interposer that mount a semiconductor device because a fine wiring pattern is formed. However, application of the printed wiring board is not limited in particular because the printed wiring board may be used not only to mount a semiconductor device but also as a mother board or an inner-layer circuit. In the discussion hereinafter, to distinguish the conductive pattern constituting the copper layer 10 from another conductive pattern constituting the conductive layer 30, conductive patterns constituting copper layer 10 will be referred to as wiring patterns (not shown) and conductive patterns constituting conductive layer 30 will be referred to as circuit pattern 31 as shown in FIG. 1.

First, the structure of the printed wiring board 100 according to the present invention will be described. The printed wiring board 100 according to the present invention has a structure in which the copper layer 10 and the conductive layer 30 facing each other via an insulating layer 20 are interlayer-connected by a filled via-hole 40 comprising a bottom composed of the conductive layer 30 as shown in FIG. 1. Note that, the words "the copper layer 10 and the conductive layer 30 are interlayer-connected" specifically means that the wiring patterns constituting the copper layer 10 and the circuit pattern 31 constituting the conductive layer 30 are electrically connected to each other. The copper layer 10 has a structure in which a copper foil layer 11, an electroless-plated copper layer 12 and an electro-plated copper layer 13 are stacked in this order. Next, the filled via-hole 40 is such that inner wall surface of a perforated-hole (hereinafter referred to as a blind-hole 41) perforating the copper layer 10 and the insulating layer 20 comprising a bottom composed of the conductive layer 30 is covered with the electroless-plated copper layer 12 and further, the blind-hole 41 is filled-up to a level substantially even with a surface of the electro-plated copper layer 13 provided on the insulating layer 20. Note that, the words "the blind-hole 41 is filled-up to a level substantially even with a surface of the electro-plated copper layer 13 provided on the insulating layer 20" means that the surface level of the electro-plated copper layer 13 filled-up in the blind-hole 41 and the surface level of the electro-plated copper layer 13 provided on the insulating layer 20 via the copper foil layer 11 and the electroless-plated copper layer 12 are substantially level with each other, and that a difference between both surface levels in a depth (thickness) direction is 5 μm or less. The printed wiring board 100 according to the present invention will be mainly described by referring a multilayer printed wiring board 100 including further insulating layer 20 (not shown) and conductive layer under the conductive layer 30. However, the printed wiring board 100 according to the present invention may be a double-sided printed wiring board as described above. Hereinafter, the structures of each layer and the filled via-hole 40 will be described.

1-1 Copper Layer

The copper layer 10 is an outer conductive layer which mounts a semiconductor device and has a structure composed of the copper foil layer 11, the electroless-plated copper layer 12 and the electro-plated copper layer 13 stacked in this order. The copper layer 10 is formed to have the total thickness (D) of 15 μm or less. Note that, the total thickness of the copper layer 10 (D) refers to a sum of thicknesses obtained by summing up thickness of the copper foil layer 11 ($D_1$), thickness of the electroless-plated copper layer 12 ($D_2$) and thickness of the electro-plated copper layer 13 ($D_3$), i.e. ($D=D_1+D_2+D_3$). By specifying the total thickness of the copper layer 10 (D) composed of three layers provided on the insulating layer 20 to be 15 μm or less, a fine wiring pattern no wider than 40 μm in pitch or L/S of 20 μm/20 μm or less can be formed by a subtractive method. To enable formation of the fine wiring pattern, total thickness of the copper layer 10 (D) is preferably 13 μm or less, and more preferably 10 μm or less. According to manufacturing method of a printed wiring board in accordance with the present invention described later, the total thickness of the copper layer 10 (D) can be made 10 μm or less and it enables formation of further finer wiring pattern. However, a wiring pattern wider than 40 μm in pitch or exceeding 20 μm/20 μm in L/S may be formed in the printed wiring board 100 according to the present invention. Next, the layers constituting the copper layer 10 will be descried one by one.

<Copper Foil Layer>

The copper foil layer 11 is formed by using a copper foil without roughening treatment having surface roughness (Rzjis) at a bonding surface of 2 μm or less and thickness of 5 μm or less. When the copper foil without roughening treatment is laminated on the insulating layer 20, a smooth bonding surface side having surface roughness (Rzjis) of 2 μm or less is attached to the insulating layer 20. By laminating the copper foil without roughening treatment having a smooth bonding surface to the insulating layer 20, overetching for complete dissolving of the roughening-treatment is dispensable, and decrease in top width of the wiring is prevented. Further, as the copper foil without roughening treatment having thickness of 5 μm or less is used, an etch-down step is dispensable. On the other hand, when copper foil having thickness exceeding 5 μm is used, reduction of thickness in the copper foil layer 11 by an etch-down step is indispensable. So, it is not preferable because the in-plane thickness deviation in the copper foil layer thickness is made larger and it affects the accuracy of circuit formation.

Thickness of copper foil layer 11 ($D_1$): Note that, thickness of the copper foil layer 11 ($D_1$) is not specified in particular in the present invention. However, a thickness ($D_1+D_2$) obtained by summing up thickness of the copper foil layer 11 ($D_1$) and thickness of the electroless-plated copper layer 12 ($D_2$) is preferably 3 μm or less. This is because when thickness ($D_1+D_2$) after depositing the electroless-plated copper layer 12 on the copper foil layer 11 exceeds 3 μm, formation of the copper layer 10 having the total thickness (D) of 15 μm or less may be made difficult. When such ultra-thin copper foil without roughening treatment is used, it is preferable to use copper foil without roughening treatment provided with a carrier in which a peelable support medium (carrier) is provided on the other side of the ultra-thin copper foil without roughening treatment opposite to the bonding surface. When the copper foil without roughening treatment provided with a carrier is used, handling ability of the copper foil without roughening treatment in lamination to the insulating layer 20 is improved and it enables using of ultra-thin copper foil having thickness of 3 μm or less.

Primer resin layer: A primer resin layer is preferably provided between the copper foil layer 11 and the insulating layer 20 in the laminate described above to assure excellent adhesion between the copper foil layer 11 and the insulating layer 20. The primer resin layer in the present invention is a 1 μm to 5 μm-thick layer composed of an insulating resin composition having excellent adhesion to the insulating layer 20. Note that, as a method for providing the primer resin layer, the primer resin film prepared and the copper foil without roughening treatment is laid on the insulating layer 20 in this order followed by hot pressing or the like. Thus, the primer resin layer is provided between the insulating layer 20 and the copper foil layer 11. As the other method, a method in which a primer resin composition is coated on a surface of the insulating layer 20 to provide a primer resin layer, then copper foil is laid on the primer resin layer followed by hot pressing or the like may be adopted.

However, it is more preferable to use copper foil without roughening treatment provided with a primer resin layer in which a primer resin layer is previously provided on the bonding surface of the copper foil without roughening treatment. When the primer resin layer is previously provided on the bonding surface of the copper foil without roughening treatment, the step for forming a primer resin layer is dispensable in formation of the laminate described above. As such copper foil without roughening treatment provided with a primer resin layer, commercially available products including "Multi-Foil (registered trademark) G (abbreviated name: MFG)" manufactured by Mitsui Mining & Smelting Co., Ltd. and "PF-E" manufactured by Hitachi Chemical Co., Ltd. can be used. In the copper foil without roughening treatment provided with a primer resin layer, the primer resin layer is provided on the bonding surface of copper foil without roughening treatment having thickness of 5 µm or less, and a carrier is provided on a surface of the copper foil without roughening treatment opposite to the bonding surface. So, handling of the copper foil without roughening treatment is made superior, and further, the copper foil without roughening treatment having suitable thickness can be selected depending on thickness ($D_1$) of the copper foil layer 11 to be formed.

<Electroless-Plated Copper Layer>

The electroless-plated copper layer 12 is a plated copper layer formed by an electroless plating method on both the surface of the copper foil layer 11 and the inner wall surface of the blind-hole 41. As the electroless-plated copper layer 12 is formed on the inner wall surface of the blind-hole 41, filling-up of the blind-hole 41 by electrolytic copper plating is made possible. Thickness of the electroless-plated copper layer 12 ($D_2$) is not specified in particular. However, the electroless-plated copper layer 12 is preferably formed to make a thickness ($D_1$+$D_2$) obtained by summing up thickness of the copper foil layer 11 ($D_1$) and thickness of the electroless-plated copper layer 12 ($D_2$) of 3 µm or less as described above. As the electroless-plated copper layer 12 is formed to give conductivity on the inner wall surfaces of the blind-hole 41, thickness of the electroless-plated copper layer ($D_2$) is sufficient as long as the layer is thick enough to be a base layer for electrolytic plating. Thus, a thickness of about 0.5 µm is acceptable.

<Electro-Plated Copper Layer)

The electro-plated copper layer 13 is a layer formed on the electroless-plated copper layer 12 to make the total thickness of the copper layer 10 (D) provided on the insulating layer 20 15 µm or less. The filling plating in the blind-hole 41 finishes in the time for depositing the electro-plated copper layer 13. Thickness of the electro-plated copper layer 13 ($D_3$) is not specified in particular in the present invention. This is because a fine wiring pattern satisfying L/S of 20 µm/20 µm or less can be formed by a subtractive method by making the total thickness of the copper layer 10 (D) 15 µm or less when the electro-plated copper layer 13 is formed depending on the thickness of the copper foil layer 11 ($D_1$) and thickness of the electroless-plated copper layer 12 ($D_2$) as described above.

Note that, the words "the electro-plated copper layer 13 is a layer formed on the electroless-plated copper layer 12 to make the total thickness of the copper layer 10 (D) provided on the insulating layer 20 15 µm or less" means the electro-plated copper layer 13 formed in consideration of thickness of the copper foil layer 11 ($D_1$) and thickness of the electroless-plated copper layer 12 ($D_2$) to make thickness of the electro-plated copper layer 13 ($D_3$) satisfy $D_3$ 15 −($D_1$ +$D_2$). That is, the expression demonstrates that thickness of the copper layer 10 according to the present invention is not adjusted by the post-treatment including an etch-down method to make thickness of the layer 15 µm or less, but the respective layers will be formed to make the total thickness of the copper layer 10 (D) 15 µm or less just after the electro-plated copper layer 13 is formed. By eliminating the post-treatment including etch-down process, the in-plane thickness deviation in the copper layer 10 is reduced to enhance accuracy of circuit formation, reliability of an obtained circuit and yield improvement.

<Filled Via-Hole>

As described above, the filled via-hole 40 is a non-perforated hole which perforates just the copper layer 10 and the insulating layer 20 comprising a bottom composed of a circuit pattern 31 constituting the conductive layer 30, and is filled-up by electrolytic copper plating to a level substantially even with a surface of the electro-plated copper layer 13 provided on the insulating layer 20. In the present invention, plating for filling-up inside of the blind-hole 41 finishes in the time for depositing the electro-plated copper layer 13 on the surface of the electroless-plated copper layer 12 to make the total thickness of the copper layer 10 provided on the insulating layer 20 15 µm or less. The diameter of the blind-hole 41 is preferably about 20 µm to 120 µm and the aspect ratio is preferably about 0.5 to 1. When the diameter and the aspect ratio of the blind-hole 41 are outside of the ranges described above, filling-up of the blind-hole 41 to a level substantially even with the surface of the electro-plated copper layer 13 provided on the insulating layer 20 by the time when the electro-plated copper layer 13 is formed to a specific thickness is made difficult. As a result, increased total thickness of the copper layer 10 (D) provided on the insulating layer 20 will be indispensable.

In the present invention, although thickness of the copper layer 10 provided on the insulating layer 20 is specified to be 15 µm or less, interlayer connection between the copper layer 10 and the conductive layer 30 is assured because the present invention adopts a structure in which an electrical connection between each wiring pattern constituting the copper layer 10 and each circuit pattern 31 constituting the conductive layer 30 is achieved by the electro-plated copper layer filled-up in the blind-hole 41. In other words, the total thickness of the copper layer 10 (D) provided on the insulating layer 20 can be reduced while assuring electrical connection between the wiring pattern constituting the copper layer 10 and the circuit pattern 31 constituting the conductive layer 30 because interlayer connection between the copper layer 10 and the conductive layer 30 is achieved by the filled via-hole 40. Consequently, because the total thickness of the copper layer 10 provided on the insulating layer 20 is thin, a fine wiring pattern satisfying L/S of 20 µm/20 µm or less can be formed even when a circuit is formed by a subtractive method.

1-2 Insulating Layer

Next, the insulating layer 20 will be described. In the present invention, a material used for formation of the insulating layer 20 is not particularly limited. Accordingly, the insulating layer 20 includes an adhesive sheet of an insulating resin composition mainly composed of insulating resin including epoxy resin, polyimide resin, cyanate resin, BT resin or thermosetting PPE resin. Further, a prepreg or the like manufactured by impregnating the insulating resin composition described above into unwoven cloth or the like composed of glass fiber or aramid resin fiber. The insulating resin composition may include inorganic filler. When the insulating resin composition includes the inorganic filler, the insulating layer 20 is made more rigid to enhance mounting ability of component and same time, improve laser processability. Next, resin-coated copper foil without roughening treatment in which a resin layer is provided on the bonding surface of the copper foil without roughening treatment described above may be used when the insulating layer 20 and the copper foil layer 11 is laminated on the conductive layer 30. Further, the insulating layer 20 may be formed by coating varnish or the like of an insulating resin composition mainly composed of the insulating resin described above on the conductive layer 30 to form a coated film, followed by a drying step, a heat treatment step, and the like.

From the viewpoint of carrying out filling plating in the blind-hole 41, thickness of the insulating layer 20 is preferably in a specific range depending on the conditions including thickness of the electro-plated copper layer 13 ($D_3$) to be provided on the insulating layer 20 and the diameter of the blind-hole 41. Specifically, thickness of the insulating layer 20 may be in a range which enables finish of the filling plating in the blind-hole 41 in the time for depositing the electro-plated copper layer 13 on the electroless-plated copper layer 12 provided on the insulating layer 20 with thickness ($D_3$) of the electro-plated copper layer 13 satisfying $D_3 \leq 15-(D_1+D_2)$.

1-3 Conductive Layer

The conductive layer 30 is a layer comprising circuit pattern 31 and is interlayer-connected to the copper layer 10 as described above. For example, the conductive layer 30 may correspond to an inner layer of the multilayer printed wiring board 100 in which the circuit pattern 31 are formed. The circuit pattern 31 comprising the conductive layer 30 are at least formed by using an electro-conductive material including copper and a copper alloy, i.e. the material and the layer thickness of the circuit patterns are not particularly limited. Note that in the present specification, portions of the conductive layer 30 electrically connected to the wiring patterns constituting the copper layer 10 are simply referred to as the circuit pattern 31 to avoid complicated discussion. The formation method, the pitch, and the like of the circuit pattern 31 are not limited in particular also. In addition, the printed wiring board 100 according to the present invention may be a double-sided printed wiring board as described above. In the double-sided printed wiring board, the conductive layer 30 corresponds to a layer comprising circuit pattern 31 formed on the other surface of the copper layer 10.

2. Manufacturing Method of Printed Wiring Board

Next, manufacturing method of a printed wiring board according to the present invention will be described. Manufacturing method of the printed wiring board according to the present invention includes a laminate formation step, a blind-hole formation step, an electroless copper plating step, a panel plating step, an etching resist formation step, and an etching step. The above-described printed wiring board 100 according to the present invention can be manufactured through the respective steps described above. Hereinafter, the method will be described one by one.

2-1 Laminate Formation Step

The laminate formation step according to the present invention is a step for forming a laminate in which a conductive layer 30, an insulating layer 20, and a copper foil layer 11 formed using copper foil without roughening treatment having surface roughness (Rzjis) at a bonding surface of 2 μm or less and thickness of 5 μm or less are laminated. Then, a case where the conductive layer 30 is an inner layer circuit of a multilayer printed wiring board will be described first.

When an adhesive sheet or prepreg composed of insulating resin composition described above is used to form the insulating layer 20, the adhesive sheet or the prepreg and the copper foil without roughening treatment are laid on the upper surface of the conductive layer 30, followed by carrying out hot pressing, vacuum lamination, or the like for bonding the conductive layer 30 and the copper foil without roughening treatment to the insulating layer 20 and then the laminate is formed. When the insulating layer 20 is formed by coating varnish composed of the insulating resin composition on the conductive layer 30 to form a coated film through a drying step, a heat treatment step, and the like, the copper foil without roughening treatment is laid on the insulating layer 20 and then hot pressing is carried out and then the laminate is formed. Note that, method for bonding the insulating layer and the copper foil without roughening treatment is not particularly limited and an appropriate method may be used arbitrarily.

When the printed wiring board 100 is a double-sided printed wiring board, copper foil without roughening treatment having surface roughness (Rzjis) at a bonding surface (lamination surface) of 2 μm or less and thickness of 5 μm or less is bonded to at least one surface of an insulating substrate and any appropriate copper foil is bonded to the other surface of an insulating substrate by using a method for manufacturing copper-clad laminates and then the laminate having a structure in which the copper foil layer 11 and the conductive layer 30 are laminated via the insulating layer 20 is formed. Thereafter, the circuit pattern 31 is formed in the conductive layer 30 in the same way when wiring patterns are formed in the copper foil layer 11. That is, the circuit pattern 31 is formed in the conductive layer 30 by using a popular method for manufacturing double-sided printed wiring boards.

The conductive layer 30 may be a layer in which the circuit pattern 31 is formed by a transfer method. In the present case, the conductive layer 30 may be the transferred circuit pattern 31 formed by an electrolytic copper plating method on a support medium composed of, for example, a stainless-steel plate, or may be the transferred circuit pattern 31 formed by, for example, etching a copper foil laminated on a support medium composed of a special sheet or the like. In the present case, the support medium may be removed arbitrarily at an appropriate step.

It is preferable to use the copper foil without roughening treatment provided with a primer resin layer in which 1 μm to 5 μm-thick primer resin layer is provided on the bonding surface of the copper foil without roughening treatment to achieve excellent adhesion between the insulating layer 20 and the copper foil layer 11 when any methods described above is adopted. Further, the copper foil without roughening treatment provided with a carrier is recommended to improve handling ability when ultra-thin copper foil without roughening treatment is bonded on the insulating layer 20.

Various pre-treatments including black-oxide treatment and soft-etching treatment are carried out on a surface of the copper foil layer 11 before an electroless copper plating step. Thickness of the copper foil without roughening treatment used in forming of the copper foil layer 11 should be selected in consideration of that thickness of the copper foil layer 11 slightly decreases in these pre-treatments.

2-2 Blind-Hole Formation Step

Next, the blind-hole formation step will be described. The blind-hole formation step is a step for providing the blind-hole 41 comprising a bottom portion composed of the conductive layer 30 in the laminate manufactured in the laminate formation step described above from the copper foil layer 11 side. The blind-hole 41 is formed by laser ablation. In the step, surface of the copper foil layer 11 may be black-oxide-treated before irradiating the laser to make formation of the blind-hole 41 by laser easy if required. For example, the blind-hole 41 perforating both the copper foil layer 11 and the insulating layer 20 and comprising a bottom composed of a circuit pattern 31 formed in the conductive layer 30 can be formed by irradiating the laminate from the copper foil layer 11 side with a carbon dioxide gas laser, a YAG laser, an excimer laser, or the like. Note that, de-smear treatment for removing resin smear remaining in the blind-hole 41 and soft-etching treatment for removing oxides on the surface of the copper foil layer 11 may be carried out after the blind-hole 41 is formed and prior to the following electroless copper plating step.

2-3 Electroless Copper Plating Step

The electroless copper plating step is a step for providing the electroless-plated copper layer 12 on the surface of the copper foil layer 11 laminated on the insulating layer 20 and on the inner wall surface of the blind-hole 41. In the electroless copper plating step, the laminate provided with the blind-hole 41 described above is first pre-dipped in a catalyst solution composed of a colloid solution of palladium (Pd) and tin (Sn) to deposit the catalyst (Pd—Sn) on the surface of the copper foil layer 11 and on the inner wall surface of the blind-hole 41, for example, as a pre-treatment. Next, tin is removed using an accelerator solution to form palladium core for promoting electroless copper plating on the surface of the copper foil layer 11 and on the inner wall surfaces of the blind-hole 41. Then, the electroless-plated copper layer 12 is formed on the surface of the copper foil layer 11 and on the inner wall surfaces of the blind-hole 41 by using a popular electroless copper plating solution appropriately prepared, such as a Rochelle salt-type electroless copper plating solution, or an EDTA-type electroless copper plating solution. Thickness of the electroless-plated copper layer 12 ($D_2$) deposited in the present step is as described above. As the plated electroless copper provides conductivity to the inner wall surfaces of the blind-hole 41, the filling plating of the blind-hole 41 by an electrolytic copper plating method is enabled in the next step.

2-4 Panel Plating Step

The panel plating step is a step for providing the electro-plated copper layer 13 on the surface of the electroless-plated copper layer 12, to make the total thickness of the copper layer 10 (D) provided on the insulating layer 20 15 µm or less, and finish the filling plating of the blind-hole 41 to a level substantially even with the surface of the electro-plated copper layer 13 provided on the insulating layer 20. Note that, the words "the total thickness of the copper layer 10 (D) to be provided on the insulating layer 20" is thickness of the copper layer 10 (D) obtained by summing up thickness of the copper foil layer 11 ($D_1$) provided on the insulating layer 20, thickness of the electroless-plated copper layer 12 ($D_2$) formed on the copper foil layer 11 and thickness of the electro-plated copper layer 13 ($D_3$) formed on the electroless-plated copper layer 12 as described above. So, the electro-plated copper layer 13 is deposited on the electroless-plated copper layer 12 provided on the insulating layer to make thickness of the electro-plated copper layer 13 ($D_3$) satisfy $D_3 \leq 15-(D_1+D_2)$ in the panel plating step. In the panel plating step, the filling plating of the blind-hole 41 finishes in the time for depositing the electro-plated copper layer 13 on the electroless-plated copper layer 12 provided on the insulating layer to make thickness of the electro-plated copper layer 13 ($D_3$) satisfy $D_3 \leq 15-(D_1+D_2)$.

Figure 2:
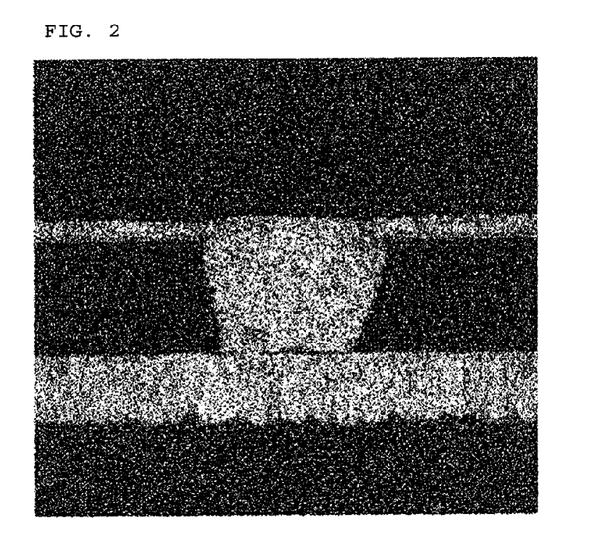
FIG. 2 is an image investigated by a metallurgical microscope showing a state of the filling plating in a blind hole and the layer structure of the printed wiring board according to the present invention.

In the panel plating step, panel plating is carried out by using an electrolytic copper plating solution enhanced in filling properties. In the present invention, the blind-hole 41 should be filled-up and same time, the electroless-plated copper layer 13 should be thinly formed on the electroless-plated copper layer 12 provided on the insulating layer 20. As the electrolytic copper plating solution enhanced in filling properties is used, the blind-hole 41 is filled-up to a level substantially even with the surface of the electro-plated copper layer 13 provided on the insulating layer 20 while the electro-plated copper layer 13 deposits to have thickness ($D_3$) which satisfies $D_3 \leq 15-(D_1+D_2)$ as shown in FIG. 2. FIG. 2 is an image showing the layer structure of the printed wiring board 100 according to the present invention. In the printed wiring board shown in FIG. 2, thickness of the copper foil layer 11 ($D_1$) is 1.5 µm, thickness of the electroless-plated copper layer 12 ($D_2$) is about 0.5 µm, and thickness of the electro-plated copper layer 13 ($D_3$) is 10 µm. In the present case, the copper foil layer 11 was formed by using copper foil (Rzjis of 1.3 µm) provided with a primer resin layer (MFG-MT manufactured by Mitsui Mining & Smelting Co., Ltd.).

The present invention adopts an electrolytic copper plating solution of which level electrodeposition property (throwing power) is made poor to concentrate in filling properties compared to the electrolytic copper plating solution used when just a plated through-hole or combination of a plated through-hole and a filled via-hole is adopted for interlayer connection structure, because just the filled via-hole 40 is used as interlayer connection structure. Consequently, the blind-hole 41 is filled-up to at least a level substantially even with the surface of the electro-plated copper layer 13 provided on the insulating layer 20 even when the electro-plated copper layer 13 is formed thin. Thus, both assurance of interlayer connection between the copper layer 10 and the conductive layer 30 and formation of the copper layer 10 provided on the insulating layer 20 to a thickness of 15 µm or less can be achieved. So, an etch-down step which is additional step after the formation of the electro-plated copper layer 13 is dispensable, and the in-plane thickness deviation of the copper layer 10 caused by etch-down is reduced; as a result, accuracy in circuit formation increases and reliability of an obtained circuit is enhanced.

Figure 3:
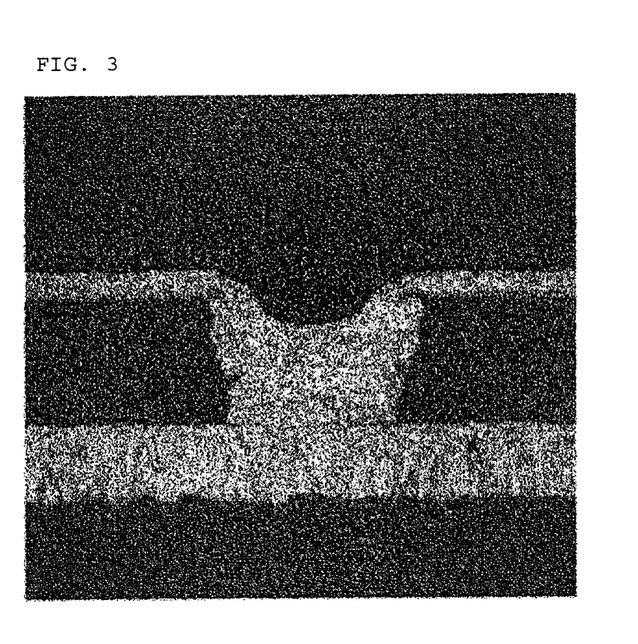
FIG. 3 is an image for comparison investigated by a metallurgical microscope showing a state of the filling plating of the blind hole and the layer structure of the printed wiring board.

Next, FIG. 3 demonstrates a filling state in the blind-hole when the panel plating step is carried out using a regular via-filling electrolytic copper plating solution to plate electrolytic copper layer 13 of 10 µm on the electroless-plated copper layer 12 provided on the insulating layer for comparison with the present invention. The printed wiring board shown in FIG. 3 was manufactured in the same way as the printed wiring board 100 shown in FIG. 2 except that the electrolytic copper plating solution was changed. As is apparent in FIG. 3, the filling in the blind-hole 41 is insufficient when the regular via-filling electrolytic copper plating solution is adopted; and the top surface of the filled via-hole is largely depressed from not only the surface level of the electro-plated copper layer 13 provided on the insulating layer 20 but also the surface of the insulating layer 20.

Figure 4:
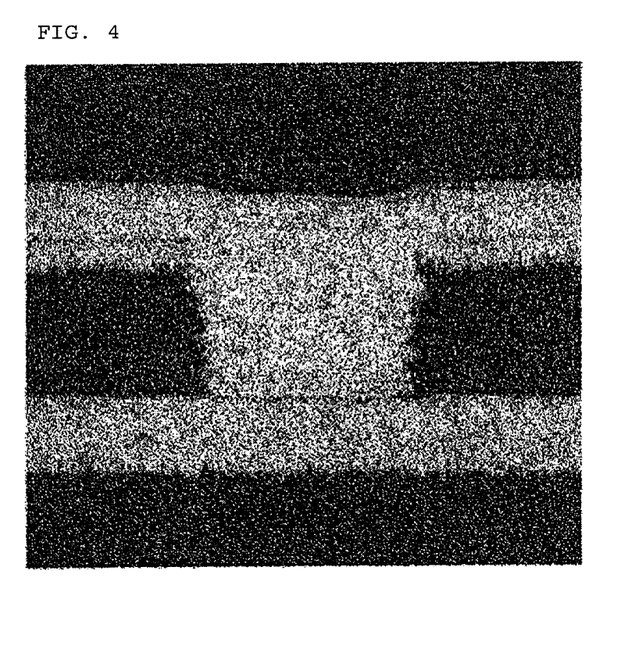
FIG. 4 is another image for comparison investigated by a metallurgical microscope showing a state of the filling plating of the blind hole and the layer structure of the printed wiring board.

Next, FIG. 4 demonstrates states of the electro-plated copper layer 13 provided on the insulating layer 20 and filling state in the blind-hole 41 when the blind-hole 41 is filled-up using the regular via-filling electrolytic copper plating solution to the extent of causing no problems in interlayer connection for comparison with the present invention. In the present case, thickness of the electro-plated copper layer 13 provided on the insulating layer was 25 µm. In the printed wiring board 100 shown in FIG. 4, the copper foil layer 11 was formed by using 12 µm-thick general-purpose electro-deposited copper foil.

As described above, the filling-up of the blind-hole 41 by electrolytic copper plating to a level substantially even with the surface of the electro-plated copper layer 13 is finished in the time for depositing the electro-plated copper layer 13 on the electroless-plated copper layer 12 provided on the insulating layer 20 to be in thickness range ($D_3 \leq 15-(D_1+D_2)$) described above because the electrolytic copper plating solution enhanced in filling properties is used in the panel plating step in the present invention. Examples of the electrolytic copper plating solution include a copper sulfate based plating solution. Note that a regular electrolytic copper plating solution is added a polymer surfactant or the like which hinders electrodeposition reaction in addition to copper sulfate and sulfuric acid to enhance throwing power. However, as filling property is more important than throwing power in the present invention, the composition of an electrolytic copper plating solution is adjusted by, for example, decreasing the amount of additives which hinders electrodeposition reaction and increasing the amount of additives which improves filling property, such as additives which enhances electrodeposition rate and additives including a leveling agent which improves leveling property. Thus, the present invention adopts an electrolytic copper plating solution enhanced in filling properties.

2-5 Etching Resist Formation Step

The etching resist formation step is a step for providing an etching resist layer having thickness of 15 μm or less on the surface of the copper layer 10 formed as described above. When thickness of the etching resist layer formed on the surface of the copper layer 10 exceeds 15 μm, formation of a fine wiring pattern satisfying L/S of 20 μm/20 μm or less by etching is made difficult even when thickness of the copper layer 10 is 15 μm or less. This is because of both poor resolution of the etching resist and insufficient circulation of an etching solution. Thickness of the etching resist layer is more preferably 10 μm or less for formation of a wiring pattern having an excellent etching factor.

In the etching resist formation step, an etching resist layer can be formed by using a dry film resist depending on a wiring pattern to be formed as an outer-layer circuit. When dry film resist is used, the etching resist layer is formed in a simple and easy manner with reduced cost. Of course, the etching resist layer may be formed by using a liquid resist. When a liquid resist is used, thickness of the etching resist layer decreases and a high-definition wiring pattern can be formed. However, as the liquid resist requires special equipment, it is preferable to use a dry film resist.

2-6 Etching Step

In the etching step, the copper layer 10 is etched to form a wiring pattern as an outer-layer circuit. In the step, a wiring pattern satisfying L/S of 20 mm/20 μm or less can be formed by providing the copper layer 10 as described above. Of course, it is applicable for a wiring pattern having L/S exceeding 20 μm/20 μm.

According to the present invention, a fine wiring pattern satisfying L/S of 20 μm/20 μm or less can be formed by a subtractive method at low costs and with high yields without introducing any special equipment or the like as described above.

INDUSTRIAL APPLICABILITY

According to the present invention, a printed wiring board including a fine wiring pattern satisfying L/S of 20 μm/20μ or less can be manufactured by a subtractive method at low costs and with high yields without introducing any special equipment or the like. So, downsizing of a packaging board or the like to be mounted with a semiconductor device can be further enhanced. In addition, as it enables manufacturing of a packaging board without introducing any special equipment or the like, new entry into the relevant field is made easy and the range of technology is made broader.

LIST OF SYMBOLS

10: Copper layer
11: Copper foil layer
12: Electroless-plated copper layer
13: Electro-plated copper layer
20: Insulating layer
30: Conductive layer
100: Printed wiring board

The invention claimed is:

1. A manufacturing method of a printed wiring board comprising:
    forming a laminate having a structure in which a copper foil layer formed using copper foil without roughening treatment having surface roughness (Rzjis) at a bonding surface of 2 μm or less and thickness of 5 μm or less is laminated to a conductive layer via an insulating layer;
    providing a blind-hole composed of a hole perforating the copper foil layer and the insulating layer; and a bottom composed of the conductive layer in the laminate;
    providing an electroless-plated copper layer on a surface of the copper foil layer and an inner wall of the blind-hole;
    providing an electro-plated copper layer on a surface of the electroless-plated copper layer to make the total thickness of a copper layer provided on the insulating layer 10 μm or less, and filling-up the blind-hole to a level substantially even with a surface of the electro-plated copper layer by an electro-plated copper;
    providing an etching resist layer having thickness of 15 μm or less on a surface of the electro-plated copper layer; and
    etching the copper layer not covered with the etching resist layer to form a wiring pattern.

2. The manufacturing method of the printed wiring board according to claim 1, wherein a sum thickness of the copper foil without roughening treatment layer and the electroless-plated copper layer after the electroless-copper plating in the providing of the electroless copper plating is 3 μm or less.

3. The manufacturing method of the printed wiring board according to claim 1, wherein the wiring pattern formed in the etching of the copper layer is L/S of 20 μm/20 μm or less.

4. The manufacturing method of the printed wiring board according to claim 1, wherein the copper foil without roughening treatment provided with a primer resin layer in which a primer resin layer is provided on the bonding surface of the copper foil without roughening treatment to assure adhesion to the insulating layer is used when the copper foil without roughening treatment is laminated to the conductive layer via the insulating layer in the forming of the laminate.

5. The manufacturing method of the printed wiring board according to claim 1, wherein the forming of the laminate excludes performing an etch-down process on the copper foil layer.

* * * * *